(12) United States Patent
Kim et al.

(10) Patent No.: US 7,933,943 B2
(45) Date of Patent: Apr. 26, 2011

(54) MULTIPLIERLESS FIR DIGITAL FILTER AND METHOD OF DESIGNING THE SAME

(75) Inventors: Jung Bum Kim, Daejeon (KR); In San Jeon, Daejeon (KR); Ik Soo Eo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1175 days.

(21) Appl. No.: 11/634,559

(22) Filed: Dec. 6, 2006

(65) Prior Publication Data

US 2007/0083581 A1    Apr. 12, 2007

(30) Foreign Application Priority Data

Dec. 6, 2005    (KR) .................. 10-2005-0118177
Mar. 23, 2006   (KR) .................. 10-2006-0026535

(51) Int. Cl.
*G06F 17/10* (2006.01)
(52) U.S. Cl. ...................................................... 708/319
(58) Field of Classification Search .................. 708/319
See application file for complete search history.

(56) References Cited

U.S. PATENT DOCUMENTS

| | | | | |
|---|---|---|---|---|
| 5,117,385 A | * | 5/1992 | Gee ................................ | 708/625 |
| 2002/0099747 A1 | * | 7/2002 | Timko et al. ................. | 708/300 |

FOREIGN PATENT DOCUMENTS

| | | |
|---|---|---|
| KR | 1019910005791 | 8/1991 |
| KR | 1019970029020 | 6/1997 |
| KR | 10-2002-0032157 | 5/2002 |
| KR | 1020020032157 | 5/2002 |
| KR | 10-2003-0071285 | 9/2003 |
| WO | WO 00-08756 | 2/2000 |

OTHER PUBLICATIONS

Maskell, D., et al., "The Design of Multiplierless FIR Filters with a Minimum Adder Step and Reduced Hardware Complexity." 2006. *ISCAS 2006*, pp. 605-608.
Macleod, M., et al., "Multiplierless FIR Filter Design Algorithms." Mar. 2005. *IEEE Signal Processing Letters*, vol. 12, No. 3, pp. 186-189.

* cited by examiner

*Primary Examiner* — Chuong D Ngo
(74) *Attorney, Agent, or Firm* — Ladas & Parry LLP

(57) ABSTRACT

Provided are a multiplierless FIR digital filter and a method of designing the same, in which a filtering operation is performed by a small addition/subtraction circuit using extracted information after analyzing the property of a given coefficient and extracting information required for design by only adding/subtracting operations. In the method of designing the multiplierless FIR digital filter, tables are created to extract and store information needed for adding and subtracting operations. An addition table is created to store values obtained by adding the input data synchronized with a clock frequency. Further, a value corresponding to multiplication is obtained by performing extraction and error correction on the added values from the tables, and an adder chain of an output terminal sums up the values and outputs the filtering results, thereby effectively implementing a logic circuit of the multipliedess FIR digital filter.

17 Claims, 5 Drawing Sheets

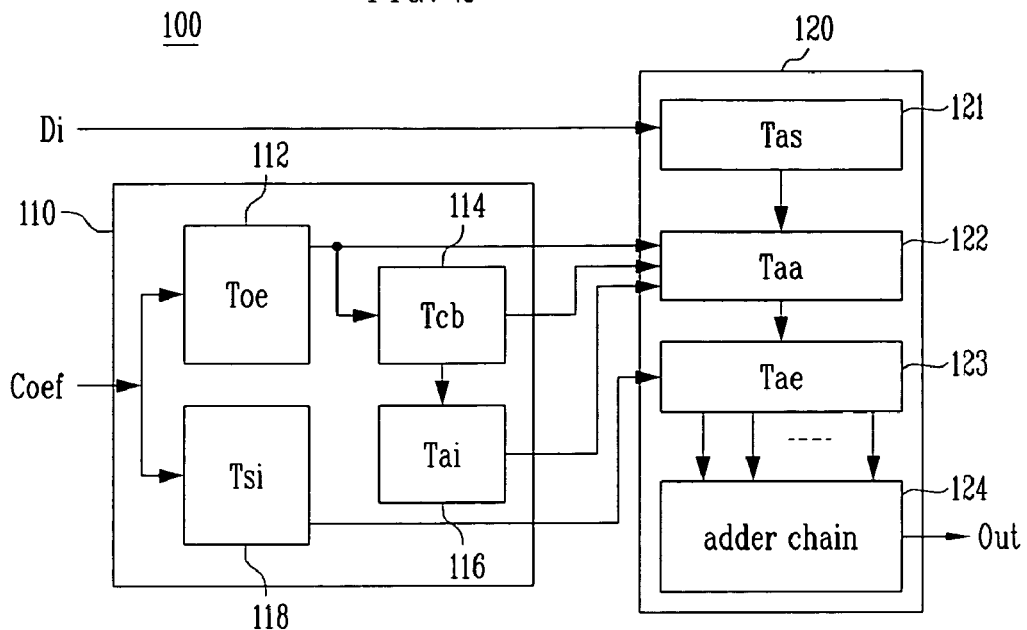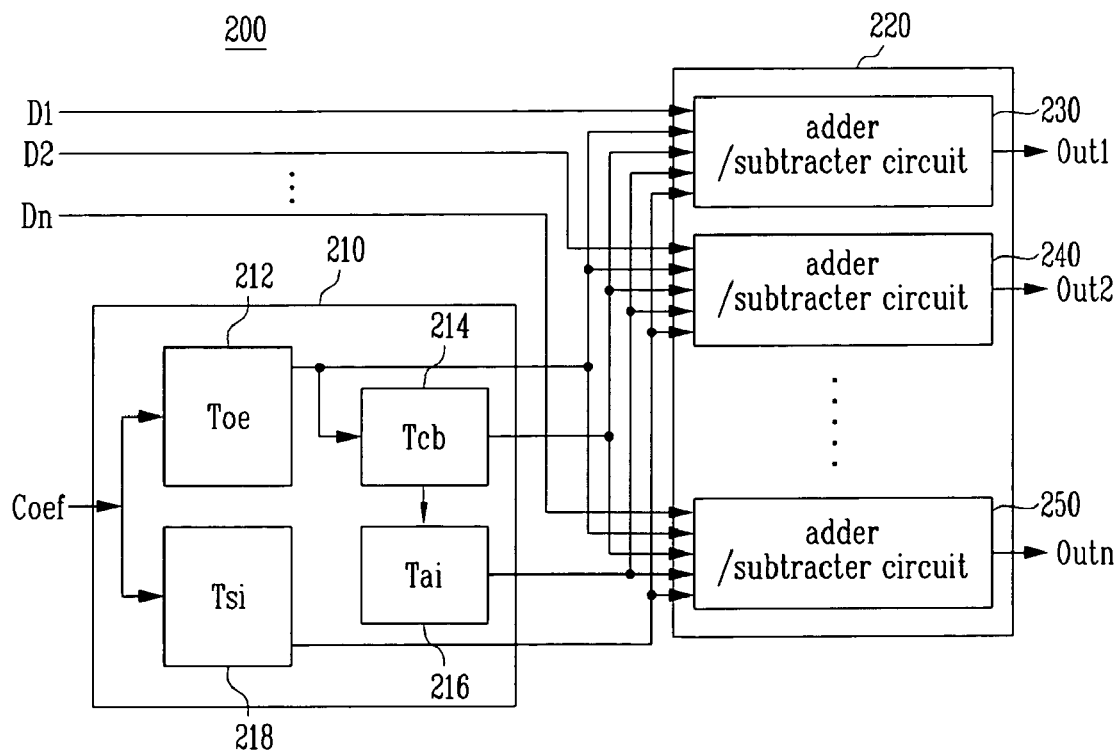

US 7,933,943 B2

MULTIPLIERLESS FIR DIGITAL FILTER AND METHOD OF DESIGNING THE SAME

CROSS-REFERENCE TO RELATED APPLICATION

This application claims priority to and the benefit of Korean Patent Application Nos. 2005-118177, filed Dec. 6, 2005, and 2006-26535, filed Mar. 23, 2006, the disclosures of which are incorporated herein by reference in their entirety.

BACKGROUND

1. Field of the Invention

The present invention relates to a multiplierless finite impulse response (FIR) digital filter and a method of designing the same, which can allow a hardware resource to be designed with a small structure when an FIR digital filter required by a transmitting or receiving terminal of a base band unit in a mobile telecommunication system is implemented in a communication system based on orthogonal frequency-division multiplexing (OFDM), orthogonal frequency-division multiple access (OFDMA) and code division multiple access (CDMA) which have recently been used as communication is improved in speed and increased in traffic.

2. Discussion of Related Art

In a typical mobile telecommunication system used with a base station and a mobile terminal, a digital filter filtering a base band digital signal is called a pulse shaping filter (PSF), and the PSF includes an infinite impulse response (IIR) filter that uses feedback for returning output to input, and a finite impulse response (FIR) filter that does not use the feedback. Hereinafter, the FIR filter will be used in describing the present invention.

In the digital filter, a bit of input data is multiplied by a coefficient in order to process a signal, so that a register is needed to temporarily store the data each processed by a bit unit. As a bit of input or the number of tap of coefficient representation becomes larger, a filtering property gets better but there are needed more registers and more logic circuits.

A high-speed linear-phase FIR filter, which has been widely used in the mobile telecommunication system, is generally designed to operate as a digital circuit using a complementary metal oxide semiconductor (CMOS). The design requirement of the FIR filter include a bit of the input data, the number of tap, and a bit of the coefficient representing the size of each tap. In proportion to the size of each given requirement, a hardware complication of the FIR filter is determined. Further, a hardware size of the FIR filter is determined and evaluated by the number of multipliers used for multiplying the input data by the coefficient of each tap rather than a bit of the general input data.

FIG. 1A illustrates a typical example of an FIR filter that is simply implemented by an arithmetic formula. As shown in FIG. 1A, an FIR filter 10 having a conventional multiplier 12 receives input data Di and shifts the input data Di per clock cycle using a shift register provided in the multiplier 12. The shifted data is multiplied by a given input coefficient Coef and summed up through an adder chain 14, thereby finally outputting a result.

Meanwhile, to solve the foregoing problems, there have been proposed various techniques and design methods using an adder/subtracter without the multiplier. As an representative example among these conventional arts, as shown in FIG. 1B, a method has been widely known, in which a given input coefficient Coef is converted into a canonic signed digit (CSD) and the input data is filtered through the adder/subtracter using the converted value. In this conventional method, a CSD code (1, 0, −1) of when a binary number b'1 is minimum is obtained and undergoes a process of finding the maximum common elements for a common subexpression elimination (CSE). Then, from the results, a shift/adder 24 and an adder chain 26 are used in performing an operation corresponding to multiplication, thereby realizing the filter.

In a conventional filter structure using an existing CSD, a binary multiplier operates depending on a shifter and an adder, so that it is important in designing the filter to find a method capable of reducing the number of times that adding operations are performed. Since the early 1990's, many researches into the CSD have been carried out. Further, various heuristic algorithms have been hitherto proposed according as a problem of finding an optimal minimum signed digit (MSD) format is estimated as an NP-complete. Nevertheless, in the filter using the existing CSD, when a given coefficient is represented into the CSD, it is known that the number of b'1 averages about ⅓ through ½, and there is a limit in that the shift/adder, i.e., an adding/subtracting operation substituting for the multiplication is needed as many as the number of b'1.

SUMMARY OF THE INVENTION

The present invention is directed to a designing method capable of reducing an adding/subtracting operation substituting for multiplication.

The present invention is also directed to a multiplierless FIR digital filter and a method of designing the same, in which a filtering operation is performed by not multipliers needed as many as the number of tap depending on design requirement but a small addition/subtraction circuit using extracted information after analyzing the property of a given coefficient and extracting information required for design by only adding/subtracting operations.

The present invention is also directed to a multiplierless FIR digital filter, in which a plurality of multiplierless FIR filters are used in supporting multi-standards in one hardware system.

One aspect of the present invention provides a multiplierless FIR digital filter comprising: a coefficient information extracting block for extracting and storing information to be processed by a filtering operation such as addition and subtraction from properties of given input coefficients; and an adder/subtracter circuit for performing the filtering operation and error correction on input data on the basis of the information stored in the coefficient information extracting block.

The multiplierless FIR digital filter may create eight or more coefficient tables by selecting and storing coefficients only greater than 8 among the coefficients with respect to coefficients of design input.

With respect to input data, the multiplierless FIR digital filter may create an addition table by determining which is greater between the input data and 9, and storing the input data and added values when the input data is smaller than 9.

Another aspect of the present invention provides a method of designing a multiplierless FIR digital filter, the method comprising the steps of: extracting and storing information to be processed by a filtering operation such as addition and subtraction from properties of a coefficient when multi input data different from each other and the same coefficients are given; performing the filtering operation on the input data; and correcting an error of a value obtained by the filtering operation on the basis of information stored in a coefficient information extracting block.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 2 is a block diagram of a multiplierless FIR digital filter according to an exemplary embodiment of the present invention;

FIG. 3 is a block diagram illustrating that the FIR filter shown in FIG. 2 is used in the plural;

DETAILED DESCRIPTION OF EXEMPLARY EMBODIMENTS

Figure 1A:
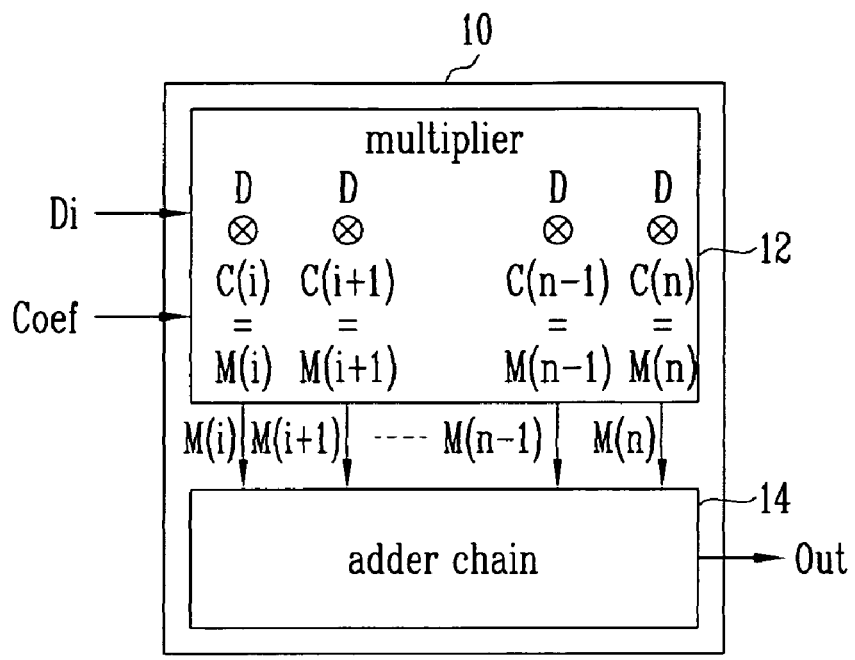
FIG. 1A is a general block diagram illustrating that an operation of a transversal FIR filter is implemented in a digital circuit using a multiplier.

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

FIG. 2 is a block diagram of a multiplierless FIR digital filter according to an exemplary embodiment of the present invention.

Referring to FIG. 2, an FIR filter 100 according to an exemplary embodiment of the present invention includes a coefficient information extracting block 110 and an adder/subtracter circuit 120. Instead of a multiplier needed as many as the number of tap of design requirement, the coefficient information extracting block 110 is used in extracting information that can undergo a filtering operation such as adding and subtracting operations from the property of a given input coefficient Coef, and the adder/subtracter circuit 120 is used in performing a filtering operation on the basis of the extracted information.

Before the adder/subtracter circuit 120 applies the filtering operation to input data Di, the coefficient information extracting block 110 performs pretreatment for the filtering operation during the first clock of the filter or during one or more clock cycles under a design condition where a clock frequency is high or a number of tap is large. For this, the coefficient information extracting block 110 includes a coefficient table/first table (Toe) 112 to store coefficients greater than "8"; a sixteen-multiple boundary table/second table (Tcb) 114 to store information on a coefficient boundary of neighboring sixteen-multiples between the coefficients given from the first table 112; a coefficient section table/third table (Tai) 116 to store information on a section between boundary values corresponding to the respective coefficients from the second table 114; and an extracting index table/fourth table (Tsi) 118 to store an index to be used for reading addition/subtraction results from a sixteen-section addition table/addition table (Tas) 121 to be described later. The coefficient information extracting block 110 can include a storage medium such as a register or a memory device, in which information for controlling the filtering operation is stored.

The adder/subtracter circuit 120 includes the sixteen-section addition table/addition table (Tas) 121; an error correction table (Taa) 122; a multiplierless result table/result table (Tae) 123; and an adder chain 124. The addition table 121 is created by setting an adding section of sixteen-multiples of which the least upper bound is the maximum value of when the coefficient is represented as an integer by taking a fractional part of the coefficient, and by adding data synchronized with the clock frequency in a unit of sixteen-sections. The error correction table 122 is created by obtaining a value corresponding to multiplication as the added values from the addition table 121 and three tables 112, 114 and 116 in the coefficient information extracting block 110 are extracted and corrected. The result table 123 is created to store values corrected by the adding and subtracting operations in the extracting index table 118 and the error correction table 122. The adder chain 124 synchronizes the multiplierless results stored in the result table 123 with the clock cycle and adds them in the form of a chain, thereby outputting the added results of the FIR filter as a result value.

According to an exemplary embodiment of the present invention, a circuit of the multiplierless FIR digital filter can be implemented by employing a design method of describing a structure with a hardware description language (HDL) or the like, and a method of making an FIR filter circuit with an automatic synthesis tool of a logic circuit on the basis of a source code of the described design. In the conventional method of implementing the digital filter with the HDL, a new code should be designed if the design requirement such as the number of tap or the like is altered. However, according to an exemplary embodiment of the present invention, it is enough to change only a design requirement value even though the number of tap is altered within an allowable standard limit of the clock frequency. The structure of the tables employed in this embodiment may be carried out by a memory such as a random access memory (RAM), a read only memory (ROM), etc., or a register storage medium according to intent of a digital circuit designer. Here, the representation of the index (value) refers to an address of the storage medium.

FIG. 3 is a block diagram illustrating that the FIR filter shown in FIG. 2 is used in the plural.

Referring to FIG. 3, an FIR filter 200 according to this embodiment of the present invention includes a coefficient information extracting block 210 and an adder/subtracter circuit block 220 having a plurality of adder/subtracter circuits 230, 240 and 250. The coefficient information extracting block 210 is used in extracting information that can undergo a filtering operation such as adding and subtracting operations from the property of a given input coefficient Coef, and each adder/subtracter circuit 230, 240 and 250 is used in performing a filtering operation on multi-input data. For reference, the coefficient information extracting block 210 and each adder/subtracter circuit 230, 240 and 250 are substantially the same as those shown in FIG. 2.

In this embodiment, the FIR filter can be used in the case of designing a single chip supporting a multi-communication standard such as WLAN (802.11g) and WiMax (802.16-2004). In this case, for the 54 Mbps (802.11a) and the 11 Mbps (802.11b) in the 802.11g, and the WiMax, the FIR filters are needed in the number of 3*2 (real number and imaginary number)=6. In addition, if the FIR filter is applied to a receiver, the FIR filters are needed in the number of 6*2=12. At this time, if the FIR filter is implemented by the multipliers, hardware use increases. On the other hand, according to the design method for the multiplierless FIR digital filter as illustrated in FIG. 3, in the case of supporting the multi-communication standard, the coefficient information extracting block is placed before the filtering operation, so that the adder/subtracter circuit can be used to be shared among different multi-input data D1, D2, ..., Dn. Accordingly, it is possible to achieve smaller hardware use. Here, the above-described FIR filters are compared under the condition that the same tap coefficient is used.

As compared with an existing filter configuration in which the same filters are simply arranged, the FIR filter of FIG. 2 according to the present embodiment is configured to simplify the adding or subtracting operation retrieving the multiplierless. Thus, the more kinds of input data are, the more effect is advantageously given to a smaller hardware structure. Further, if the existing FIR filter is required to be changed in standard, the present invention can easily and rapidly change the existing FIR filter into the multiplierless FIR filter. In other words, according to the present embodiment, margin to design the FIR filter is enhanced.

Below, processes of creating the foregoing tables will be described in sequence with reference to FIGS. 2, 4, 5 and 6. In the following descriptions, properties of the filter are varied according to whether total number of tap is odd or even, so that it will be considered.

Figure 4:
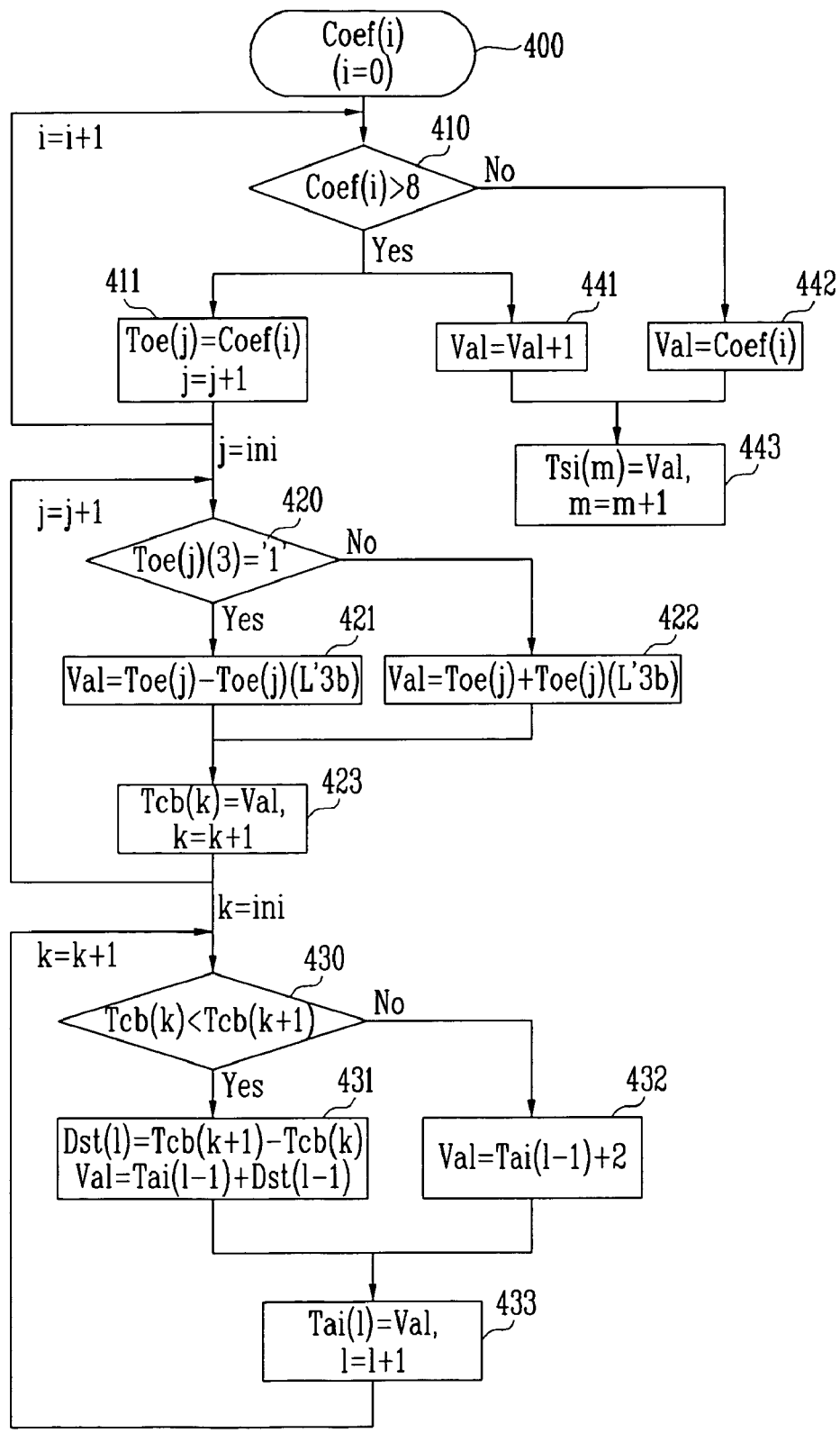
FIG. 4 is a flowchart of storing a table with addition/subtraction information extracted from a coefficient given by design requirement in the FIR filter according to an exemplary embodiment of the present invention.

FIG. 4 is a flowchart of storing a table with addition/subtraction information extracted from a coefficient given by design requirement in the FIR filter according to an exemplary embodiment of the present invention.

As shown in FIGS. 2 and 4, firstly, the coefficient table/first table (Toe) 112 selecting a coefficient greater than "8" is created. Suppose total number of coefficients given by the design requirement is Cn, n input coefficients Coef (i) 400 is Chn=Cn/2 at an even function and is Chn=Cn/2+1 at an odd function because of the properties of a Sync function $$\left(\frac{\sin(x)}{x}\right).$$

Further, $Chn^{th}$ coefficient has the maximum coefficient value Cmax. With regard to each input coefficient Coef(i) (where, i=0, 1, 2, ..., n−1, n=Chn), at operation 411, the coefficient greater than "8" is stored in the first table Toe(j) (where, j=0, 1, 2, ..., s−1, s<n) through a comparison operation 410. In the comparison operation 410, negative coefficients are changed into positive bits by 2's complement, and then compared. Further, all coefficients of the first table Toe(j) are represented as a positive value (positive integers or bits) by taking bits of a fractional part.

Secondly, the sixteen-multiple boundary table/second table (Tcb) 114 having sixteen-multiple section information is created. For this, among the coefficients of the first table Toe(j) previously created by the comparison operation 420, a value of b'3 is regarded as a sign for a value obtained by converting lower four bits b'3b'2b'1b'0 through a 2's complement. Further, at operation 423, a value of b'2b'1b'0 allows the second table to be stored with the boundary information of the coefficient that changes the Toe(j) into sixteen-multiples. In other words, if b'3 denoting the sign is negative ('1') at the comparison operation 420, the second table Tcb(k) 423 is stored with Val 421 obtained by subtracting the value of b'2b'1b'0 from the corresponding coefficient of the Toe(j). On the other hand, if b'3 is positive ('0'), the second table Tcb(k) 423 is stored with Val 422 obtained by adding the value of b'2b'1b'0 to the corresponding coefficient. Here, all initial values of Tcb(k) are set into "16"; the coefficient greater than "8" and smaller than "32" is used as an initial value (ini) of "k"; and a total number of "k" is the number of coefficients greater than "8", which is equal to the number of first tables Toe(j). In results, the coefficients greater than "32" will be stored while creating the second table, and the stored values are used as a boundary reference value for the addition table when the error correction is applied to a filter output candidate value (including errors) to be stored in the sixteen-section addition table/addition table (Tas) 121.

Thirdly, the coefficient section table/third table (Tai) 116 having information about a section between the coefficients is created. For this, the values Tcb(k) and Tcb(k+1) of the previously created second table are compared at a comparison operation 430. If Tcb(k+1) is greater than Tcb(k), difference (Tcb(k+1)−Tcb(k)) is obtained, and temporary array Dst(l) 431 is stored with upper bit values except lower 4 bits from the obtained difference, and a Tai(l) 433 is stored with a value Val obtained by adding a Dst(l−1) to a Tai(l−1). On the other hand, if Tcb(k+1) is smaller than or equal to Tcb(k) at the comparison operation 430, there is no need to use the temporary array for the following step Tai(l+1), so that the Tai(l) 432, 433 is stored with a value obtained by just adding "2" to Tai(l−1). Here, all initial values of the third table Tai(l) are set into "9", and an initial value (ini) and a total number of "1" are the same as those of the second table Tcb(k). The reason why all initial values of the third table Tai(l) are set into "9" is because the ninth Tas(9) stores an addition/subtraction value corresponding to the coefficient value of "16" in the addition table (Tas, to be described later). The created third table is used as an index for reading values from the addition table when the error correction is applied to the addition table.

Fourthly, the extracting index table/fourth table (Tsi) 118 for reading addition/subtraction results is created. At the comparison operation 410 used in creating the first table 112, if the coefficient Coef(i) is greater than "8", "Val=⌈C max/16⌉+8" is used as an initial value and increased by "1", which is stored in the fourth table Tsi(m) (441, 443). On the other hand, if the coefficient Coef(i) is equal to or smaller than "8" at the comparison result 410, the coefficient Coef(i) is stored in the fourth table Tsi(m) (442, 443). A value of the fourth table Tsi(m) (where, m=0, 1, 2, ..., m−1, m=⌈C max/16⌉+8+Toe) can be used as an index for reading values from the table (Taa) performing the error correction. When the Val is calculated at the operation 441 of FIG. 4, though not illustrated in FIG. 4, a current value Val is stored with "9" instead of being increased by 1 if i=16. As described in creating the third table (Tai), this is because a reference value "16" of the sixteen-section addition table (Tas) is allocated to a certain value of the fourth table Tsi(9) regardless of whether there is "16" among the given coefficients.

Below, the addition table (Tas) created by addition of sixteen-sections, and the error correction table (Taa) created by the error correction of applying the adding and subtracting operations to the addition table (Tas) through the previously created three tables (Toe, Tcb, Tai) will be described.

Figure 5:
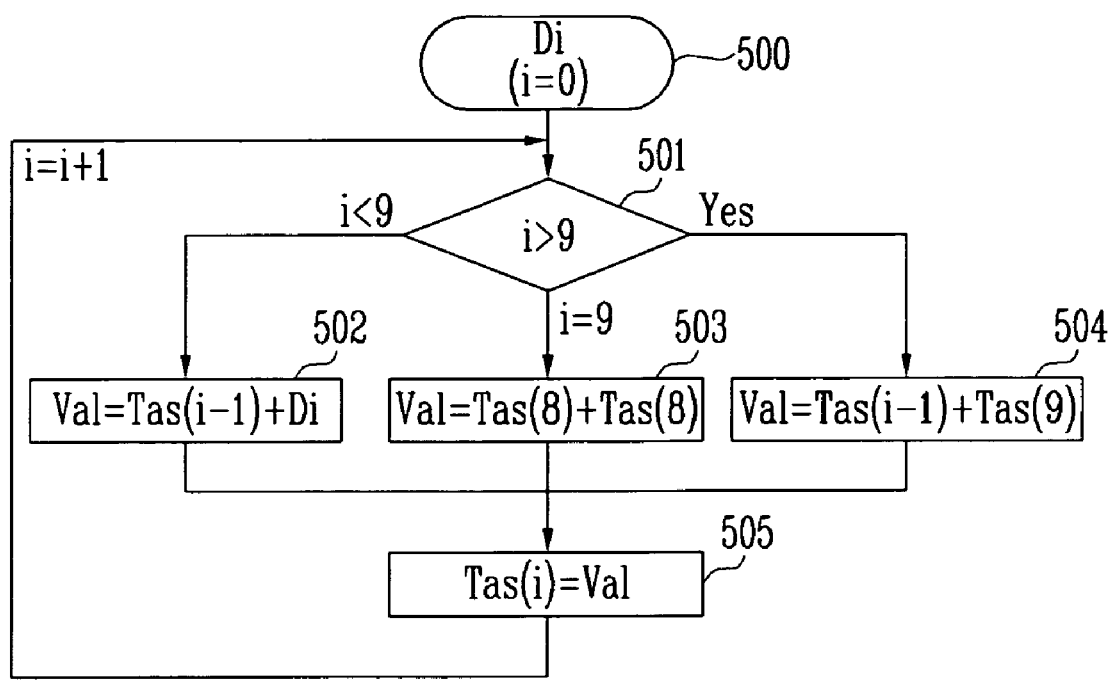
FIG. 5 is a flowchart of creating an addition table by applying coefficients of sixteen sections to input data given by the FIR filter according to an exemplary embodiment of the present invention.

FIG. 5 is a flowchart of creating an addition table by applying coefficients of sixteen sections to input data given by the FIR filter according to an exemplary embodiment of the present invention.

Referring to FIGS. 2 and 5, to create the addition table (Tas) corresponding to the multiplication of an existing FIR fitter multiplying coefficients, with regard to input data Di 500 in sequence synchronized with a clock frequency, if i (where, i=0, 1, 2, ..., n−1) is smaller than "9" at a comparison operation 501, Val 502 obtained by adding the input data Di to the addition table Tas(i−1) is stored in the addition table Tas(i) 505. Meanwhile, if i is equal to "9" at the comparison operation 501, Val 503 obtained by adding the addition table Tas(8) itself to the addition table Tas(8) is stored in the addition table Tas(i=9; corresponding to the coefficient of "16") 505. On the other hand, if i is greater than "9" at the comparison operation 501, Val 504 obtained by adding the addition table Tas(9) fixed at the coefficient of "16" to the addition table Tas(i−1) is stored in the addition table Tas(i) 505. Here, i is "n=⌈C max/ 16⌉+8", and the addition values smaller than "9" at the comparison operation 501 is used as values resulting from operating a given original input coefficient itself and used as a correction value of the error correction for the addition table (Tas). In this operation, the created sixteen-section addition table (Tas) has addition values divided into sixteen sections if i is greater than "9"; addition values divided as much as the size of input data if i is smaller than "9"; and addition values used as a reference of sixteen sections if i is equal to "9".

Meanwhile, if operation of the adder chain is directly applied to the previously created addition table (Tas), an error is generated. Accordingly, according to this embodiment, a value corrected by the adding and subtracting operations to the addition table (Tas) is created and stored in the error correction table (Taa), and the corrected values corresponding to the multiplication of the existing filter are processed through the adder chain provided at an end stage.

Figure 6:
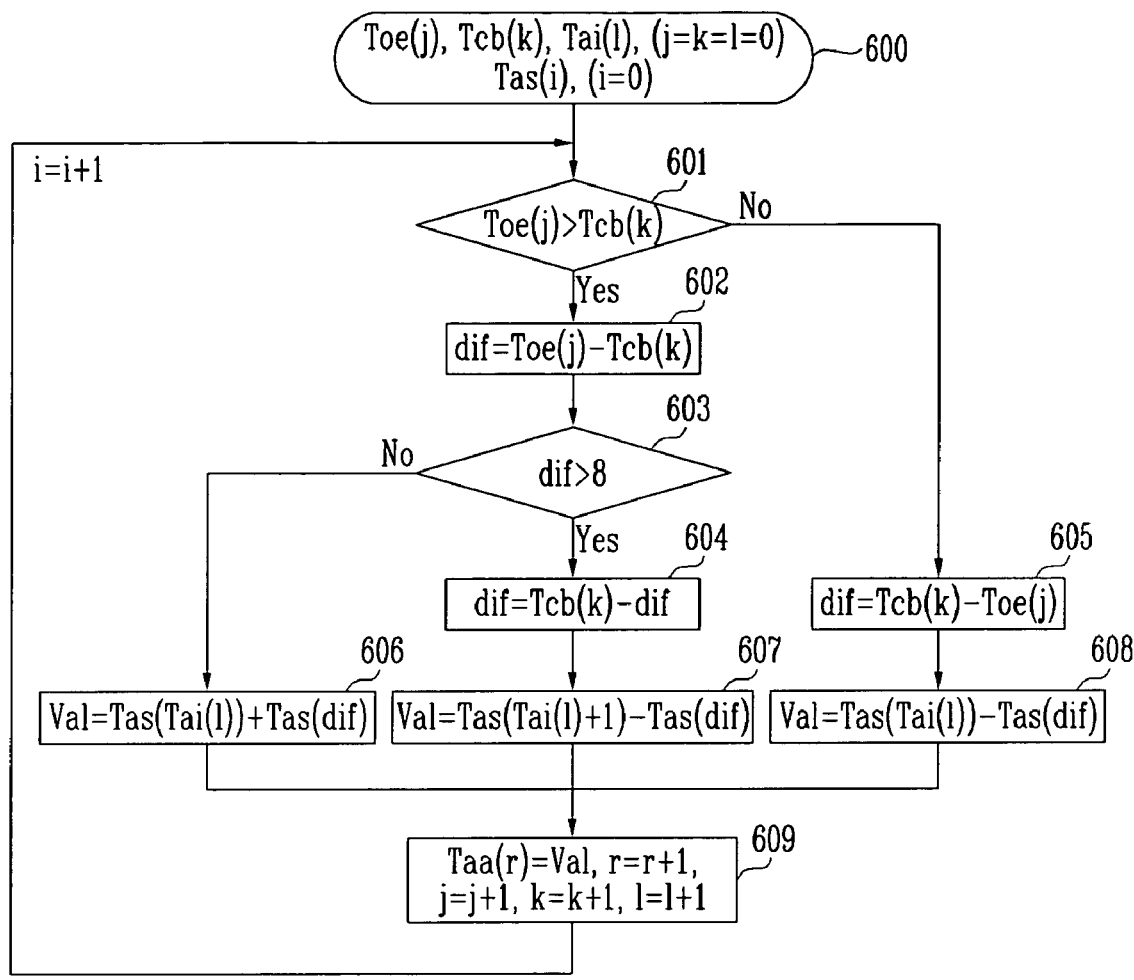
FIG. 6 is a flowchart of determining addition/subtraction, applying operation, and performing error correction as to a value of the addition table created in FIG. 5 by a value of the tables created in FIG. 4.

FIG. 6 is a flowchart of determining addition/subtraction, applying operation, and performing error correction as to a value of the addition table created in FIG. 5 by a value in the tables created in FIG. 4.

Before performing the error correction, the result values of the addition table Tas(i) is copied to the error correction table Taa(r). Here, the number of "r" is equal to a sum of the number of Tas(i) and the number of Toe(j). An initial value of "r" is obtained by adding "1" to the number of Tas(i), i.e., "⌈C max/16⌉+8". Further, after the previously created first, second and third tables Toe(j), Tcb(k) and Tai(l) and the indexes j, k, l and i of the addition table Tas(i) are initialized into "0" at an operation 600, the error correction is started.

Specifically, as shown in FIG. 6, the first and second tables Toe(j) and Tcb(k) are compared at a comparison operation 601. If Toe(j) is larger than Tcb(k), a difference dif 602 between Toe(j) and Tcb(k) is obtained. If Toe(j) is not larger than Tcb(k), a difference diff 605 between Tcb (k) and Toe(j) is obtained, and Val 608 obtained by subtracting Tas (dif) having an index of the difference dif 605 from Tas(Tas(l)) having an index of the third table value "Tai(l)" is stored in the error correction table Taa(r) 609.

Then, if the difference dif 602 is greater than "8" at another comparison operation 603, a difference dif 604 is obtained by subtracting the difference dif 602 from Tcb(k), and Val 607 obtained by subtracting Tas(dif) having an index of the difference dif 604 from Tas(Tai(l)+1) having an index of "Tai (l)+1" is stored in the error correction table Taa(r) 609.

On the other hand, if the difference dif 602 is smaller than "8" at the comparison operation 603, Val 606 obtained by adding Tas(dif) having an index of the difference diff 602 to Tas(Tai(l)) having an index of "Tai(l)" is stored in the error correction table Taa(r) 609.

The validity of the foregoing error correction is given because Tas(dif) having the indexes of the differences dif 602, 604, 605 employs lower 3 bits included in Tas(i) itself as an error correction value, and the most approximate index is obtained among the values of the addition table (Tas) with regard to the respective given coefficients when the created second table Tcb is obtained. Further, in comparison with the multiplication of the original input coefficients, values represented by the lower 3 bits for the error correction include all by the adding and subtracting operations with respect to the boundary value of the second table Tcb(k) created in sixteen sections.

From the error correction table Taa(r) 609 created by correcting an error of the addition table Tas, a value to be added in the adder chain is extracted, thereby creating the multiplierless result table (Tae) 123. Here, the value to be added corresponds to the output of the multiplier shown in FIG. 1A.

Specifically, the addition/subtraction results are read from the error correction table Taa(r) by the respective index of the fourth table Tsi(m), and stored in the multiplierless result table Tae(t). Here, "t" denotes the number Chn of given input coefficients, i.e., t=Chn(t=1, 2, . . . , Chn−1).

The created result table Tae processes only Chn=Cn/2 coefficients because of symmetricalness of coefficients among a Cn-number of given coefficients, and adds the other Cn/2 coefficients just in descending order or adds Chn coefficients through the adder chain. Alternatively, the result table Tae may employ publicly know methods. Further, the values of the result table Tae is processed by a method of converting negative coefficients among coefficients given when the first table Toe is created into positive coefficients, and a method of converting the result values of the corresponding result table Tae into negative result values by 2's complement.

Figure 1B:
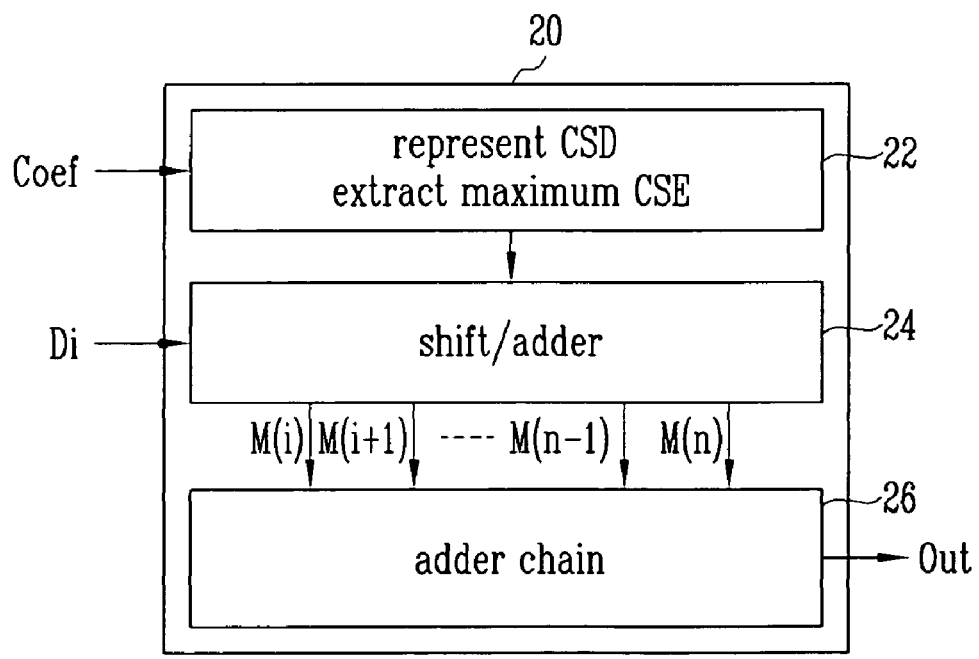
FIG. 1B is a general block diagram of a FIR filter using an existing canonical signed digit (CSD)

Lastly, the multiplierless result values from the created multiplierless result table Tae(t) are input to a circuit of the adder chain 124, and summed up synchronizing with the clock cycle in the structure of a chain. In the last stage, addition of Tae(Cn−1)+Tae(Cn) is output as result values of the FIR filter. An adder chain operation employs a general logic circuit, and the values of the result table Tae(t) have the same input value as M(i) (t=i, i=0, 1, 2, . . . , n) of FIGS. 1A and 1B.

With regard to "24 (Chn=Cn/2)", results of the respective stages as follows under the condition that 48-taps and 8-bits coefficient are given as the inputs.

TABLE 1

| Ord | Coef | Int | Toe | Tcb | Tai | Tsi | Tas | Taa | Tae | etc |
|-----|----------|-----|-----|-----|-----|-----|-----|-----|-----|------|
| 0   | 00000000 | 0   | 12  | 16  | 9   | 0   | 0   | 0   | 0   | Di = 3 |
| 1   | 11111111 | −1  | 10  | 16  | 9   | 1   | 3   | 3   | −3  |      |
| 2   | 11111110 | −2  | 24  | 16  | 9   | 2   | 6   | 6   | −6  |      |
| 3   | 00000000 | 0   | 20  | 16  | 9   | 0   | 9   | 9   | 0   |      |
| 4   | 00000100 | 4   | 36  | 32  | 10  | 4   | 12  | 12  | 12  |      |
| 5   | 00000110 | 6   | 80  | 80  | 13  | 6   | 15  | 15  | 18  |      |
| 6   | 00000101 | 5   | 116 | 112 | 15  | 5   | 18  | 18  | 15  |      |
| 7   | 00000000 | 0   | 127 | 128 | 16  | 0   | 21  | 21  | 0   |      |
| 8   | 11111010 | −6  |     |     |     | 6   | 24  | 24  | −18 |      |
| 9   | 11111000 | −8  |     |     |     | 8   | 48  | 48  | −24 |      |
| 10  | 11111001 | −7  |     |     |     | 7   | 96  | 96  | −21 |      |
| 11  | 00000000 | 0   |     |     |     | 0   | 144 | 144 | 0   |      |

TABLE 1-continued

| Ord | Coef | Int | Toe | Tcb | Tai | Tsi | Tas | Taa | Tae | etc |
|---|---|---|---|---|---|---|---|---|---|---|
| 12 | 00001000 | 8 | | | | 8 | 192 | 192 | 24 | |
| 13 | 00001100 | 12 | | | | 17 | 240 | 240 | 36 | |
| 14 | 00001010 | 10 | | | | 18 | 288 | 288 | 30 | |
| 15 | 00000000 | 0 | | | | 0 | 336 | 336 | 0 | |
| 16 | 11110000 | −16 | | | | 9 | 384 | 384 | −48 | |
| 17 | 11101000 | −24 | | | | 19 | | 36 | −72 | |
| 18 | 11101100 | −20 | | | | 20 | | 30 | −60 | |
| 19 | 00000000 | 0 | | | | 0 | | 72 | 0 | |
| 20 | 00100100 | 36 | | | | 21 | | 60 | 108 | |
| 21 | 01010000 | 80 | | | | 22 | | 108 | 240 | |
| 22 | 01110100 | 116 | | | | 23 | | 240 | 348 | |
| 23 | 01111111 | 127 | | | | 24 | | 348 | 381 | |
| 24 | | | | | | | | 381 | | |

Table 1 shows the operation results obtained when input data is set as "Di=3", and results of the last result table Tae according to an exemplary embodiment of the present invention are equal to values in a "Tae" row of Table 1.

As shown in Table 1, with regard to the coefficients of 48-taps and 7 bits (without considering most significant bit (MSB) that indicates a sign among 8 bits), the conventional CSD is in need of about (48/2−6)*2.5=45 adders/subtracters if the symmetricalness of coefficients and the number of coefficients of "0" are excluded. Here, "2.5" is an average value of the 7 bits coefficients. On the Contrary, according to the present invention, in the case that the maximum coefficient is 127 (7 bits), the adder of the addition table Tas has an operation number of "[C max/16]+8=16", and the error correction table Taa has 8-subtractions 602, 604, 605 for finding the indexes, 8-additions 606 for the error correction, and 8-subtractions 607, 608 for the error correction. Thus, the present invention uses the total number of 40 adders/subtracters, so that the FIR filter can be implemented with less adding and subtracting operations than those of the conventional CSD.

According to an exemplary embodiment of the present invention, adders are used for four extra coefficients regardless of the input coefficients among the added results of the addition table, and there is no hardware use for creating four tables to extract addition and subtraction information from the coefficients as compared with the conventional CSD. That is, because these four tables are not changed in the coefficient during the filtering operation, results of separately executing the coefficient extracting block are described in a design_package file of the HDL language that defines parameters of logic design condition, thereby applying a logic synthesis to the adder/subtracter circuit without requiring wasteful hardware use.

As described above, the present invention provides a multiplierless FIR digital filter and a method of designing the same, in which:

First, when a digital filter is designed, a multiplier having a complicated design is not used, and it is possible to reduce the number of adding or subtracting operations substituting for the multiplier without using an existing CSD.

Second, in the case of supporting input data of multi communication standard, a structure of a filter can be simply and effectively implemented.

Third, it is possible to miniaturize and decrease the cost of a signal processor, a modem chip, etc., which include a base band processor used in a communication system based on OFDM, OFDMA, CDMA, or the like.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A multiplierless FIR digital filter comprising:
a coefficient information extracting block receiving given input coefficients and extracting and storing information to be processed by a filtering operation such as addition and subtraction from properties of the given input coefficients, wherein the coefficient information extracting block creates a first table by selecting and storing coefficients having an absolute value greater than 8 among the coefficients; and
an adder/subtracter circuit receiving input data and the information stored by the coefficient information extracting block, and performing the filtering operation and error correction on the input data on the basis of the information stored in the coefficient information extracting block.

2. The multiplierless FIR digital filter according to claim 1, wherein the coefficient information extracting block determines addition or subtraction through a preset comparison operation by taking a most significant bit among the 4 least significant bits of the coefficient with regard to each coefficient in the first table, applies an adding or subtracting operation to the 3 least significant bits, and stores the operation results as values in a second table.

3. The multiplierless FIR digital fitter according to claim 2, wherein the coefficient information extracting block calculates a difference between neighboring values in the second table, stores the difference excluding the 4 least significant bits of the difference in a temporary array, adds a value of the temporary array to a value corresponding to the first table, and creates a third table to store the added results.

4. The multiplierless FIR digital filter according to claim 3, wherein the coefficient information extracting block determines which is greater between the coefficient and 8, and creates fourth table for storing a value obtained by increasing an initial value "Val=[C max/16]+8 (where, Cmax is the maximum coefficient)" by "1" when the coefficient is greater than 8 and storing the absolute value of the coefficient when the coefficient is smaller than or equal to 8.

5. The multiplierless FIR digital filter according to claim 4, wherein a fifth table is created and the adder/subtracter circuit determines which is greater between an index value of the fifth table and 9, and a value obtained by adding the input data to a previous index value in the fifth table when the index value of the fifth table is smaller than 9 is stored in the fifth table.

6. The multiplierless FIR digital filter according to claim 5, wherein the adder/subtracter circuit doubles a value stored in the eighth index of the fifth table when the index value is equal to 9, and stores the results in the fifth table.

7. The multiplierless FIR digital filter according to claim 5, wherein when the index value is greater than 9, values obtained by adding the values of the ninth index in the fifth table to a previous index value in the fifth table are stored in the fifth table.

8. The multiplierless FIR digital filter according to claim 7, wherein the coefficient information extracting block and the adder/subtracter circuit determine which is greater between a value in the first table and a corresponding value in the second table, and calculate a difference for error correction according to the determined result.

9. The multiplierless FIR digital filter according to claim 8, wherein the coefficient information extracting block and the adder/subtracter circuit create an sixth table for storing a value obtained by subtracting a value in the fifth table using a value difference between the second table and the first table as an index, from the corresponding value of the fifth table when the value in the first table is equal to or smaller than the value in the second table.

10. The multiplierless FIR digital filter according to claim 9, wherein the coefficient information extracting block and the adder/subtracter circuit set a value obtained by subtracting a value difference between the first table and the second table, from the value in the second table as a difference for new error correction when the value in the first table is greater than the value in the second table and a value obtained by subtracting the value in the second table from the value in the first table is greater than 8.

11. The multiplierless FIR digital filter according to claim 10, wherein the coefficient information extracting block and the adder/subtracter circuit create a sixth table for storing a value obtained by subtracting a value in the fifth table using the difference for the new error correction as an index from the corresponding value of the fifth table.

12. The multiplierless FIR digital filter according to claim 11, wherein the coefficient information extracting block and the adder/subtracter circuit create an sixth table for storing a value obtained by adding a value in the fifth table using a value difference between the first table and the second table as an index, from the corresponding value of the fifth table when the value in the first table is greater than the value in the second table and a value obtained by subtracting the value in the second table from the value in the first table is smaller than or equal to 8.

13. The multiplierless FIR digital filter according to claim 9, wherein a value in the sixth table is read by the index in the fourth table, and a seventh table is created to store the read value.

14. The multiplierless FIR digital filter according to claim 1, wherein the plurality of adder/subtracter circuits compose an adder/subtracter circuit block to perform a filtering operation and error correction on multi input data.

15. A computer implemented method of designing a multiplierless FIR digital filter, the method comprising:
   extracting and storing information to be processed by a filtering operation such as addition and subtraction from properties of coefficients in a coefficient information extracting block when multi input data different from each other and the same value of coefficients are given;
   performing by a processor the filtering operation about the input data by creating an addition table for setting an adding section of which a least upper bound is the maximum value of when the coefficient is represented into an integer by taking a fractional of the coefficient, and storing values obtained by adding the input data synchronized with a clock frequency; and
   correcting an error of a value obtained by the filtering operation on the basis of information stored in the coefficient information extracting block.

16. The computer implemented method according to claim 15, wherein extracting and storing the information comprises:
   creating a coefficient table for storing an absolute value of coefficients greater than 8 among the coefficients;
   creating boundary table for storing boundary information on neighboring coefficients among the coefficients given from the coefficient table;
   creating a coefficient section table for storing information on sections between boundaries corresponding to the respective coefficients in the boundary table; and
   creating an extracting index table for storing an index used to read addition/subtraction results from the addition table performing the filtering operation.

17. The computer implemented method according to claim 16, wherein correcting the error comprises:
   creating a result table for storing results of which an error is corrected by adding/subtracting the values stored in addition table; and
   summing up values stored in the result table through an adder chain circuit and outputting the added results.

* * * * *